(12) United States Patent
Zinner et al.

(10) Patent No.: US 11,223,898 B2
(45) Date of Patent: Jan. 11, 2022

(54) AUDIO SYSTEM INCLUDING SPEAKERS WITH INTEGRATED AMPLIFIER AND METHOD OF DETECTING SPEAKERS

(71) Applicant: Radio Sound, Inc., Louisville, KY (US)

(72) Inventors: Wayne Zinner, New Albany, IN (US); Ernest Theodore Sims, III, Louisville, KY (US); Matthew Kane Gant, Louisville, KY (US)

(73) Assignee: RADIO SOUND, INC., Louisville, KY (US)

( * ) Notice: Subject to any disclaimer, the term of this patent is extended or adjusted under 35 U.S.C. 154(b) by 0 days.

(21) Appl. No.: 16/267,998

(22) Filed: Feb. 5, 2019

(65) Prior Publication Data

US 2019/0246205 A1 Aug. 8, 2019

Related U.S. Application Data

(60) Provisional application No. 62/626,355, filed on Feb. 5, 2018.

(51) Int. Cl.
*H04R 3/04* (2006.01)
*H03F 3/185* (2006.01)
(Continued)

(52) U.S. Cl.
CPC ............... *H04R 3/04* (2013.01); *H03F 3/183* (2013.01); *H03F 3/187* (2013.01);
(Continued)

(58) Field of Classification Search
CPC . H04R 3/04; H03F 3/183; H03F 3/187; H03F 3/45475
See application file for complete search history.

(56) References Cited

U.S. PATENT DOCUMENTS

| | | | |
|---|---|---|---|
| 6,078,670 A | * | 6/2000 | Beyer ..................... H03G 3/32 381/101 |
| 9,020,153 B2 | | 4/2015 | Britt, Jr. |

(Continued)

FOREIGN PATENT DOCUMENTS

| | | | | |
|---|---|---|---|---|
| JP | 201639451 | | 11/2017 | |
| WO | WO-2013164229 A1 | * | 11/2013 | ........... H03F 1/0205 |

OTHER PUBLICATIONS

English machine translation of JP 2016-39451.

*Primary Examiner* — Regina N Holder
(74) *Attorney, Agent, or Firm* — Stites & Harbison, PLLC; Michael S. Hargis

(57) ABSTRACT

An audio system includes a variable voltage power supply and at least one remotely positioned speaker assembly. The speaker assembly includes a driver (e.g., a tweeter) and a switching amplifier. Moving the switching amplifier to a remote position within the speaker assembly provides numerous design advantages and allows for utilization of a smaller power supply. In addition, the audio system is configured to detect a type of the at least one speaker and to adjust an output voltage of the variable voltage power supply accordingly. This allows for reconfiguration and/or expansion of original systems. A related method of detecting a type of speaker electrically connected to an audio source is also provided.

18 Claims, 7 Drawing Sheets

(51) Int. Cl.
  *H03F 3/187* (2006.01)
  *H03F 3/45* (2006.01)
  *H03F 3/183* (2006.01)

(52) U.S. Cl.
  CPC ..... *H03F 3/45475* (2013.01); *H03F 2200/03* (2013.01); *H03F 2200/321* (2013.01)

(56) References Cited

U.S. PATENT DOCUMENTS

| | | | |
|---|---|---|---|
| 9,469,254 B1* | 10/2016 | White | H04R 1/026 |
| 2006/0104453 A1* | 5/2006 | Lee | H04S 7/301 |
| | | | 381/59 |
| 2009/0103758 A1* | 4/2009 | Maeshiba | H04R 1/2865 |
| | | | 381/345 |
| 2014/0029782 A1* | 1/2014 | Rayner | H04R 3/00 |
| | | | 381/386 |
| 2015/0030184 A1* | 1/2015 | Yamada | H03F 1/025 |
| | | | 381/120 |
| 2016/0366499 A1* | 12/2016 | McGarry | H04R 1/023 |
| 2017/0149403 A1* | 5/2017 | Cho | H03F 3/183 |
| 2017/0250662 A1 | 8/2017 | Cope et al. | |
| 2017/0344102 A1 | 11/2017 | Kolla et al. | |
| 2018/0077491 A1 | 3/2018 | Butler et al. | |

* cited by examiner

AUDIO SYSTEM INCLUDING SPEAKERS WITH INTEGRATED AMPLIFIER AND METHOD OF DETECTING SPEAKERS

This application claims the benefit of U.S. Provisional Patent Application No. 62/626,355, filed Feb. 5, 2018, the disclosure of which is incorporated herein by reference.

FIELD OF THE INVENTION

This disclosure relates to the audio system arts and, more particularly, to a system utilizing speakers having integrated amplifiers.

BACKGROUND OF THE INVENTION

Vehicles such as cars or motorcycles typically have an audio system utilizing one or more audio speakers. Traditionally, an integrated power supply and amplifier power speakers remotely positioned around the vehicle. Utilizing switching amplifiers which are more efficient than traditional amplifiers, however, allows the size of the amplifiers to be reduced allowing the amplifiers to be positioned within the speakers remotely located around the vehicle.

Switching amplifiers, however, require a higher operating voltage than generally provided by vehicles resulting in the need to step up power supply output voltages. Thus, in order to modify or upgrade an integrated power supply and amplifier system, the traditional speakers must be replaced with speakers having integrated amplifiers and the integrated power supply and amplifier system would require replacement to accommodate the higher voltage needs. In addition, modification of an audio system utilizing speakers having integrated amplifiers by, for example, replacing original equipment 50 W speakers with 100 W speakers would similarly require replacement of parts including the speakers and power supply to accommodate different voltage needs of the 100 W speakers.

Accordingly, a need is identified for a solution that provides greater packaging flexibility and allows for modifications and upgrades with minimal hardware changes and other problems that perhaps have not yet been discovered.

SUMMARY OF THE INVENTION

In accordance with the purposes and benefits described herein, an audio system is provided. The audio system includes an audio source producing an audio signal, a variable voltage power supply providing an output voltage, at least one speaker assembly including a driver and a switching amplifier receiving the output voltage and audio signal, and detection circuitry configured to detect a type of the at least one speaker assembly and adjust the output voltage of the variable voltage power supply provided to the amplifier dependent upon the detected type of the at least one speaker.

In another possible embodiment, the detection circuitry includes a controller and an associated analog to digital converter.

In yet another possible embodiment, the variable voltage power supply and a first portion of the detection circuitry are in a housing and the at least one speaker assembly includes a second portion of the detection circuitry.

In still another possible embodiment, the audio system further includes a digital signal processor configured to adjust a frequency response of the audio signal.

In one other possible embodiment, the audio system further includes first and second balanced audio drivers providing the audio signal over balanced audio lines to the switching amplifier.

In another possible embodiment, the detection circuit includes a voltage divider.

In yet still another possible embodiment, the first portion of the detection circuitry includes a first resistor and the second portion of the detection circuitry includes a second resistor which first and second resistors form the voltage divider.

In still another possible embodiment, the first portion of the detection circuitry includes the controller, analog to digital converter, and first resistor and the second portion of the detection circuitry includes the second resistor.

In yet another possible embodiment, the variable voltage power supply and the first portion of the detection circuitry are in a housing and the second portion of the detection circuitry is in the at least one speaker assembly.

In one other possible embodiment, the audio system includes a digital signal processor configured to adjust a frequency response of the audio signal, wherein the digital signal processor is positioned within the housing.

In another possible embodiment, the invention is included in a vehicle. In another embodiment, the vehicle is a motorcycle.

In one other possible embodiment, an audio system for a vehicle includes an audio source for providing an audio signal, a housing including a variable output power supply, at least two speaker assemblies positioned remote from the housing on the vehicle, each of the speakers including a driver and a switching amplifier, and detection circuitry configured to detect a type of the switching amplifier in each of the at least two speaker assemblies and to adjust an output voltage of the variable output power supply provided to each switching amplifier in the at least two speaker assemblies dependent upon the type of switching amplifier detected.

In another possible embodiment, a first portion of the detection circuitry includes a controller and is in the housing and a second portion of the detection circuitry is in each of the at least two speaker assemblies.

In yet another possible embodiment, the detection circuitry includes a voltage divider wherein the first portion of the detection circuitry includes a first resistor of the voltage divider and the second portion of the detection circuitry includes a second resistor of the voltage divider.

In still another possible embodiment, the controller is configured to convert an output of the voltage divider into a digital signal used in determining the output voltage of the variable output power supply provided to each switching amplifier in the at least two speaker assemblies, and the audio signal is provided to the at least two speaker assemblies over balanced audio lines to the switching amplifier.

In one other possible embodiment, the audio system includes a digital signal processor configured to adjust a frequency response of the audio signal, wherein the digital signal processor is positioned within the housing.

In addition, a method of detecting a type of speaker electrically connected to an audio source is provided. The method includes the steps of superimposing a voltage on balanced audio lines connected to the speaker, the speaker including a driver and a switching amplifier, determining a detection voltage utilizing a voltage divider, converting the detection voltage from an analog signal to a digital signal, and adjusting an output voltage of a variable output power supply provided to the switching amplifier dependent upon the detection voltage.

In another possible embodiment, the method further includes the step of isolating the detection voltage from audio circuitry utilizing coupling capacitors.

In the following description, there are shown and described several preferred embodiments of audio systems and related methods. As it should be realized, the systems and methods are capable of other, different embodiments and their several details are capable of modification in various, obvious aspects all without departing from the methods and systems as set forth and described in the following claims. Accordingly, the drawings and descriptions should be regarded as illustrative in nature and not as restrictive.

BRIEF DESCRIPTION OF THE DRAWING FIGURES

The accompanying drawing figures incorporated herein and forming a part of the specification, illustrate several aspects of the invention and together with the description serve to explain certain principles thereof. In the drawing figures.

Reference will now be made in detail to the present preferred embodiments of the audio system and related methods, examples of which are illustrated in the accompanying drawing figures, wherein like numerals are used to represent like elements.

DETAILED DESCRIPTION

Figure 1:
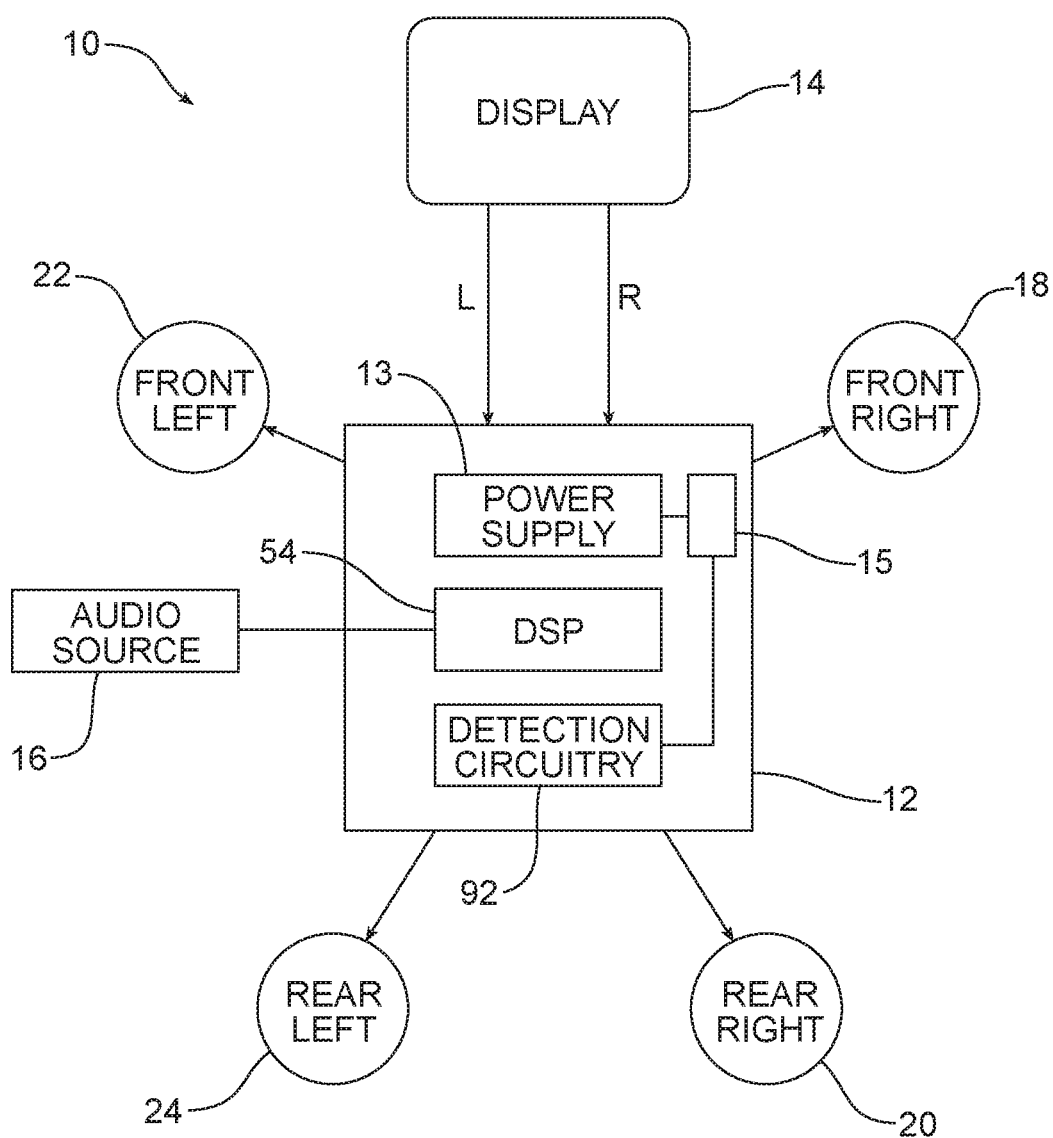
FIG. 1 is an overall schematic of an audio system.

Referring to FIG. 1, an audio system 10 includes a power supply housing 12 including a power supply 13, a display 14, an audio source 16, and a plurality of audio speakers 18, 20, 22, and 24. A first speaker assembly is designated a front right speaker assembly 18, a second speaker assembly is designated a rear right speaker assembly 20, a third speaker assembly is designated a front left speaker assembly 22, and a fourth speaker assembly is designated a rear left speaker assembly 24 in the described embodiment. Other embodiments may include more or fewer speaker assemblies within the audio system.

Figure 2:
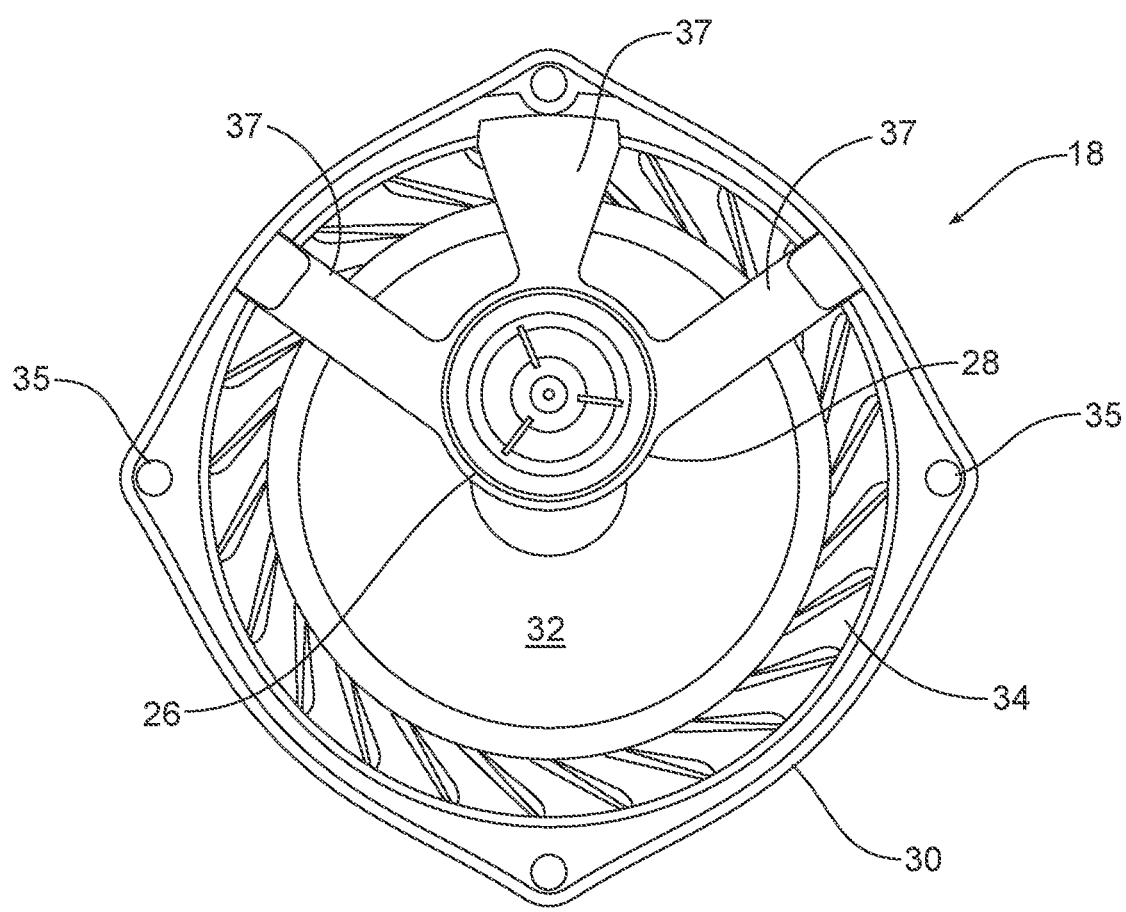
FIG. 2 is a perspective view of a front side of a speaker assembly.

As shown in FIG. 2, a speaker assembly (e.g., front right speaker 18) (hereinafter "speaker 18"), includes a driver 26 supported by a bracket 28. The bracket 28 is in turn supported by a basket 30. A diaphragm or cone 32 is attached to the driver 26 and a surround 34 joins the cone to the basket 30 as is generally known. The basket 30 includes mounting holes 35 for mounting the speaker in a traditional manner.

While speaker 18 is presently described, it should be noted that each of the speakers 18, 20, 22, and 24 within the audio system 10 are the same in the described embodiment except for their mounting position on the vehicle. In other embodiments, the speakers may each be different (e.g., a speaker may be formed to fit within a particular footprint of the vehicle), differing groups may be different (e.g., one pair of speakers may be 50 W speakers and a second pair 100 W speakers), and/or additional speakers may be added to the system as will be described in more detail below.

Figure 3:
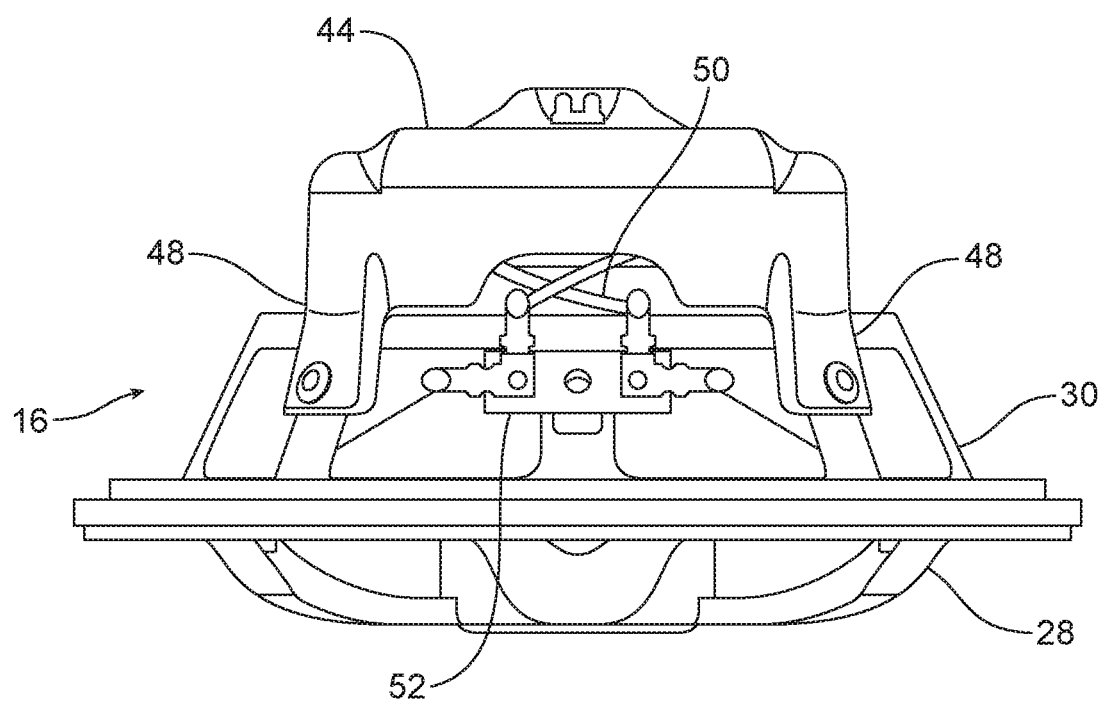
FIG. 3 is a side elevational view of a speaker assembly.

As shown in FIGS. 2 and 3, the bracket 28 includes three legs 37 extending from the basket 30 which centrally support the driver 26 at a front location of the basket. In the described embodiment, the driver 26 is a tweeter while other embodiments may include other types of transducers that convert electrical audio signals to sound waves (e.g., woofers, subwoofers, midrange drivers, and/or combinations thereof). Similarly, the bracket 28 may take other forms dependent upon design requirements and/or preference or may not be required at all.

Figure 4:
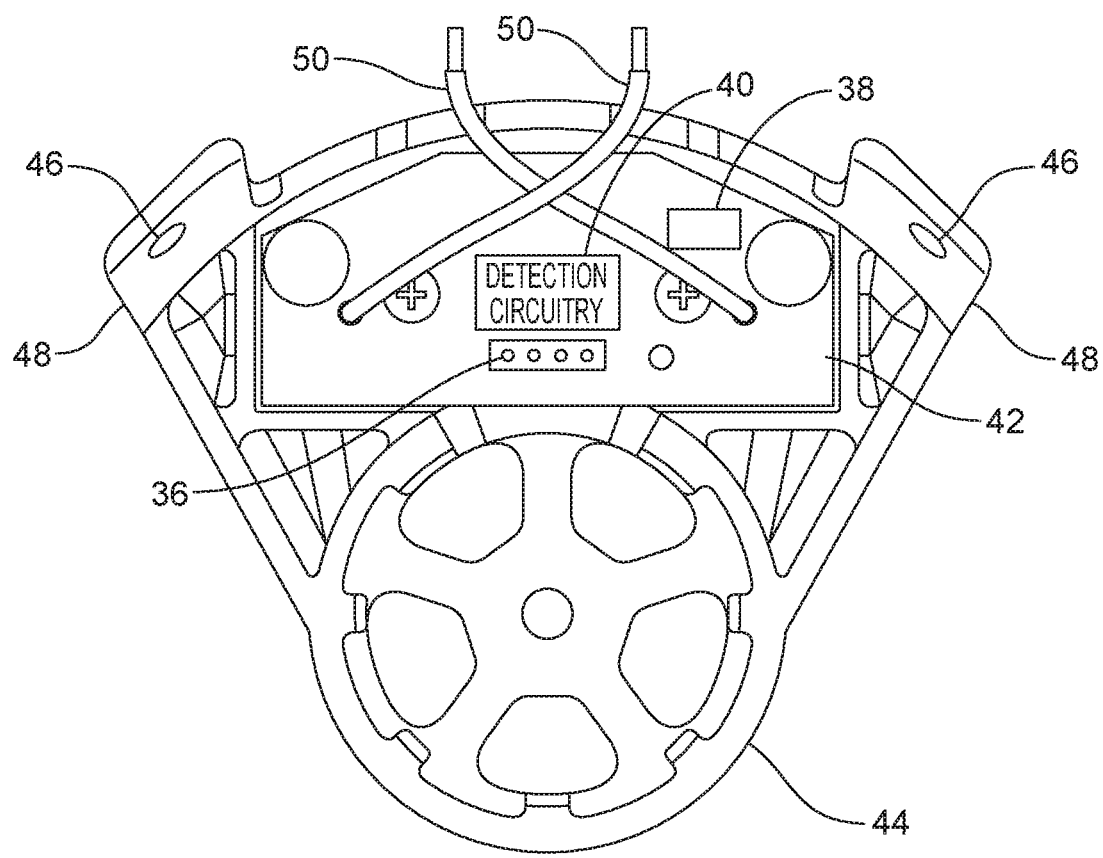
FIG. 4 is top view of an amplifier housing which forms a part of the speaker assembly.

As shown in FIG. 4, a four-pin connector 36, an amplifier 38, and a portion of detection circuitry 40 are mounted on a printed circuit board 42 which board is physically supported by a housing 44. The housing 44 includes mounting holes 46, formed in legs 48, for mounting the housing 44 to the basket 30 as shown in FIG. 3. It should be appreciated that the above-described speaker configuration could be implemented in many different packaging arrangements. In one embodiment, for example, a single basket could be molded, or otherwise formed, to accommodate both the driver and printed circuit board/amplifier eliminating the need for a separate housing.

In the described embodiment, wires 50 extending from the printed circuit board 40 electrically connect the board to a terminal block 52 as shown in FIG. 3. In other words, the terminal block 52 is utilized to electrically connect the driver 26 to the amplifier 38. More specifically, the four-pin connector 36 provides power and ground to the driver 26. Providing ground in this manner reduces system noise and is thus preferred over a local ground. That said, a local ground could be used.

In a 50 W speaker embodiment, pin 1 of the four-pin connector 36 is connected to an output voltage of power supply 13 (e.g., +24V), pin 2 is connected to a non-inverting audio signal of digital signal processor (DSP) 54, pin 3 is connected to the inverting audio signal of digital signal processor (DSP) 54, and pin 4 is connected to ground. Switched power of the amplifier 38 is output to the driver 26. Similarly, in a 100 W speaker embodiment, pin 1 of the four-pin connector 36 is connected to an output voltage of power supply 13 (e.g., +32V), pin 2 is connected to a non-inverting audio signal of digital signal processor (DSP) 54, pin 3 is connected to an inverting audio signal of digital signal processor (DSP) 54, pin 4 is connected to ground, and switched power is output to the driver 26.

As indicated above, the amplifier 38 is a switching amplifier. In an audio system 10 utilizing 50 W speakers, a Texas Instruments TPA3110D2 15-W (per channel), Class D audio power amplifier may be utilized. Similarly, when 100 W speakers are utilized, a Monolithic Power Systems MP7770 45 W (per channel), Class D audio amplifier may be utilized. Of course, other switching amplifiers may be utilized in other embodiments. As is known, switching amplifiers are more efficient than conventional amplifiers (e.g., amplifiers which rely on linear gain, such as, Class A amplifiers). Improved efficiency means less heat dissipation is required which allows the amplifiers to be smaller and lighter weight. Both attributes improve packaging flexibility which is appreciated and useful within the vehicle industry.

Switching amplifiers, however, require a power supply which provides a higher voltage than the 14V voltage typically supplied by conventional vehicle charging systems. While it is known to step up a 14V voltage supplied by a conventional system to a higher voltage by providing a power supply as part of the amplifier, this approach results in a larger than desired package that includes both power and amplification functions due to, among other reasons, the above noted heat dissipation issues.

The described audio system 10 separates the power supply 13 from the switching amplifiers 38 which amplifiers are included in the individual speakers (e.g., 18, 20, 22, and 24). Moving the amplifier function to the individual speakers allows for utilization of a smaller power supply than has traditionally been used. While physically smaller, the power supply 13 used in the described embodiment provides greater flexibility in design by providing variable output voltages of up to 42V. The output voltages are dependent upon the type of speaker connected thereto as determined by associated detection circuitry.

The power supply 13 would provide a 24V output voltage for a 200 W audio system having four 50 W speakers, for example, or a 32V output voltage if a 400 W audio system having four 100 W speakers was detected. Of course, other combinations of speaker types/wattages could be utilized within the audio system 10. Thus, the power supply 13, i.e., the smart power supply, provides flexibility in system configuration and reconfiguration by accommodating speakers of varying types/wattage ratings. This is particularly beneficial in the instance where a vehicle owner desires to upgrade their audio system. For example, if a vehicle owner wanted to change the 50 W original equipment speakers to 100 W speakers, the upgrade could be accomplished without having to replace the power supply to accommodate the higher output voltage requirement of the 100 W speakers.

Figure 5:
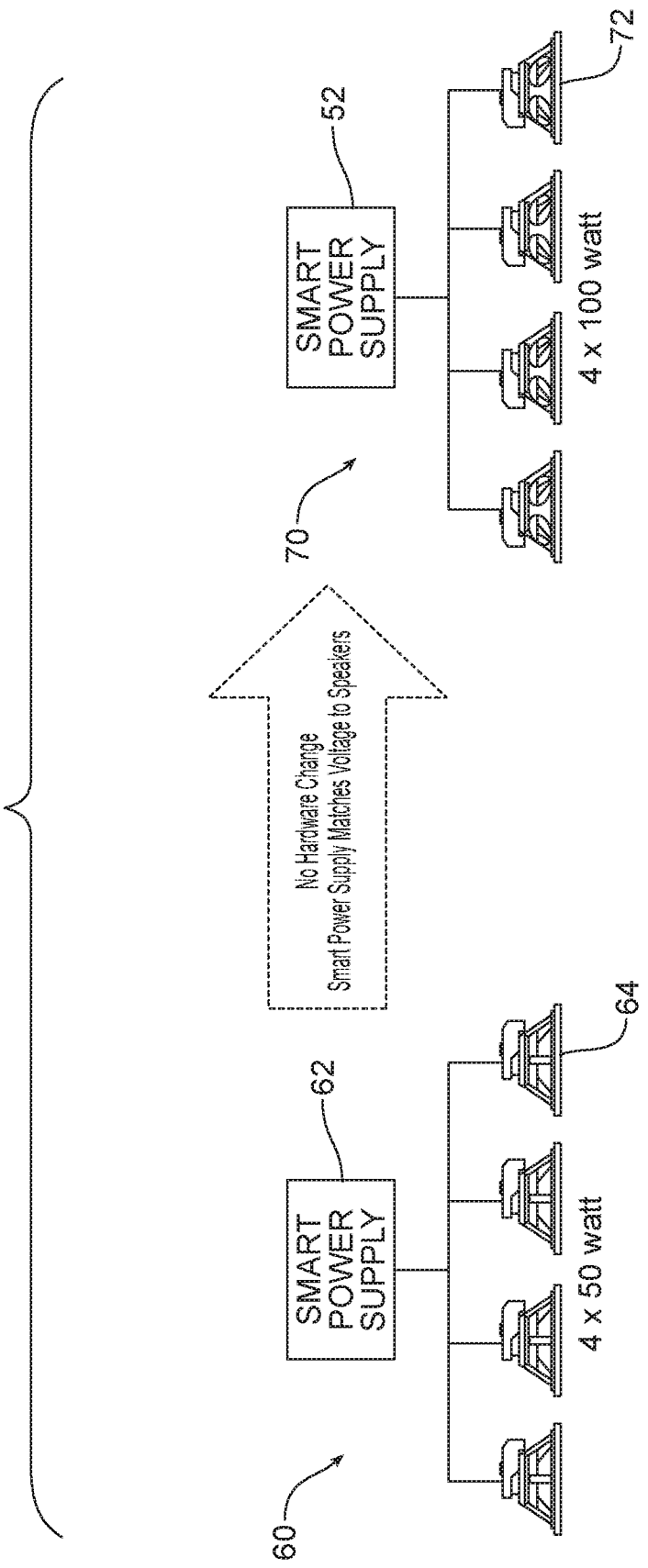
FIG. 5 is an illustration showing the differences between an original audio system and a converted audio system.

In other words, full integration of the switching amplifier into the speakers and utilization of a smart power supply allows greater flexibility in packaging design and allows the vehicle owner to simply and affordably modify an original equipment system, for example, to a more robust audio system. As shown in FIG. 5, an exemplary original audio system 60 including a smart power supply 62 and four 50 W speakers 64 can be modified to an upgraded audio system 70 including the smart power supply 62 and four 100 W speakers 72 without changing any additional system hardware. In other words, the four 50 W speakers 64 are simply unplugged from the original audio system 60 and four different speakers 72 are plugged in in their place resulting in the upgraded audio system 70. Of note is the utilization of the smart power supply 62 in both systems.

To accommodate such reconfigurations, a controller 15 (e.g., microcontroller or microprocessor) is configured to automatically determine a type/wattage of speaker connected to the audio system 10 at start up as indicated above. In the described embodiment, a Texas Instruments TM4C1230H6PM Series microcontroller is utilized although different brands/types of controllers could be utilized and configured to perform the desired functions. Even more, detection circuitry, or a detection system, is utilized to detect the speaker type/wattage (e.g., whether there is a 50 W speaker or a 100 W speaker connected within the audio system 10). If 50 W speakers are detected, the controller 15 in turn causes the power supply output voltage to become an appropriate 24V voltage. Similarly, if 100 W speakers are detected, the controller 15 would cause the power supply 13 to provide a 32V output voltage. The utilization of power supply 13, controller 15, and detection circuitry facilitates both upgrades of original equipment (e.g., replacing a 50 W speaker with a 100 W speaker) and expansion of the original audio system 10 (e.g., adding additional speakers) as will be described in more detail below.

Figure 6:
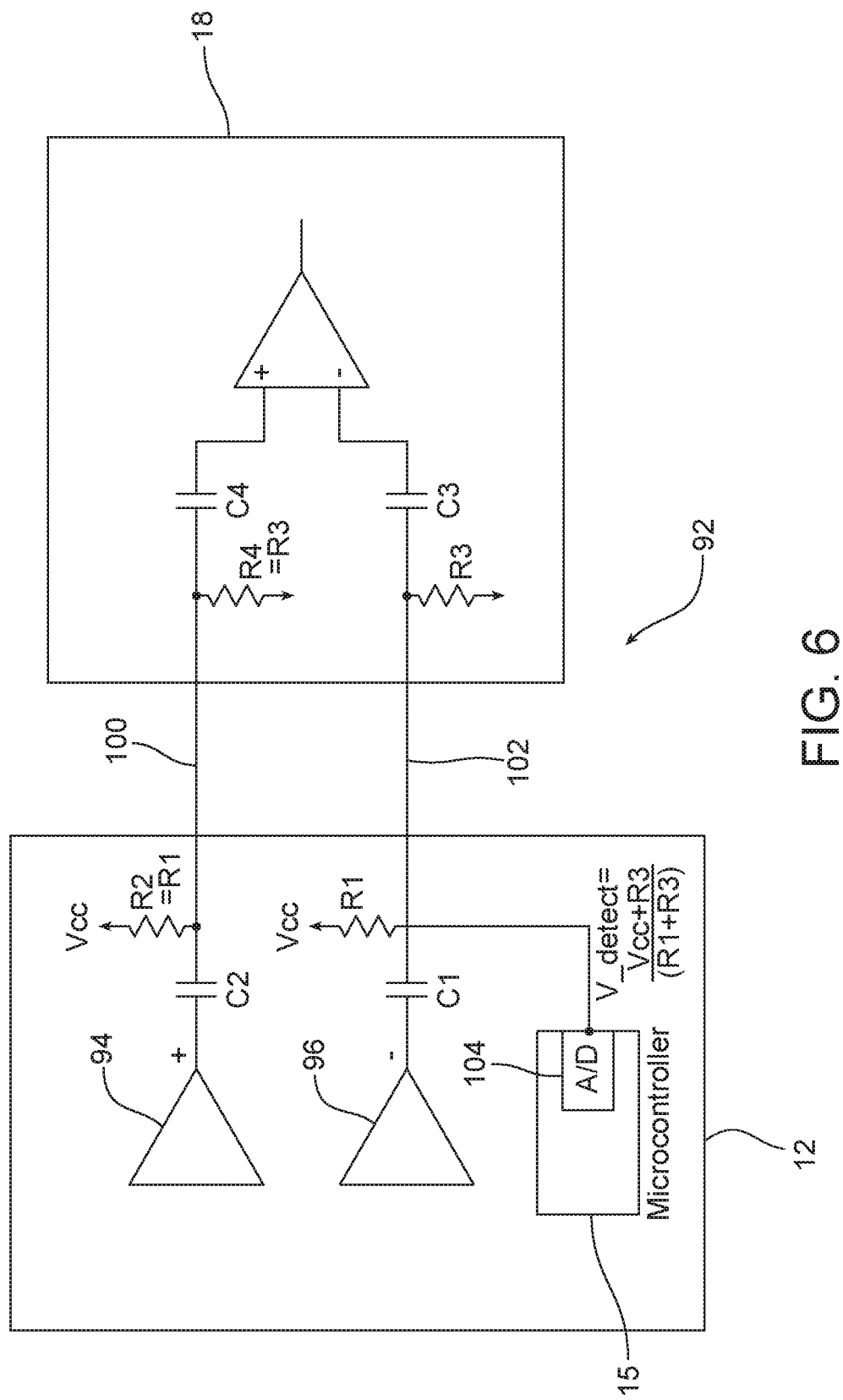
FIG. 6 is a schematic showing detection circuitry.

Exemplary detection circuitry, which could be incorporated into the audio system 10, is shown in FIG. 6. In the described embodiment, a first portion of the detection circuitry 92 and balanced audio drivers 94, 96 are positioned on the printed circuit board within power supply housing 12. A second portion of the detection circuitry 40 is positioned on the printed circuit board 42 within the speaker 18. The balanced audio drivers 94, 96 receive audio signals from digital signal processor (DSP) 54 and are connected, for example, to the remote switching amplifier 38 positioned within speaker 18. As shown, the detection circuitry 92 detects a type/wattage of the speaker 18 by superimposing a detection voltage (V_detect) onto balanced audio lines 100, 102. The advantage of this technique is that it does not require a separate wire to be used for the detection signal although this approach could be utilized in alternate embodiments.

As shown, resistors R1 and R3 form a voltage divider in which the detection voltage V_detect is determined by a ratio of the resistors R3 and R1. Specifically, V_detect=(Vcc+R3)/(R1+R3). In the described embodiment, the detection voltage is isolated from the audio circuitry by the coupling capacitors C1 through C4 and detected by an analog to digital converter 104 within the controller 15. Of course, the analog to digital converter 104 could be a separate integrated circuit in other embodiments. Resistors R2 and R4 are present in the circuit primarily to maintain balance in the audio lines 100, 102, with R2=R1 and R4=R3.

Even more, an audio signal is received by digital signal processor (DSP) 54 from the audio source 16 (e.g., a radio, CD player, mobile phone, etc.). The digital signal processor (DSP) 54 may be a Cirrus Logic CS47024 audio-system-on-a-chip (ASOC) for example or similar device. In the described embodiment, the digital signal processor (DSP) 54 optimizes the frequency response based on varying factors including, for example, vehicle speed, and provides an audio output signal to the vehicle speakers 18. More specifically, the audio output signal is provided to the amplifier 38 within the speakers 18 via the balanced audio drivers 94, 96 and audio lines 100, 102.

Figure 7:
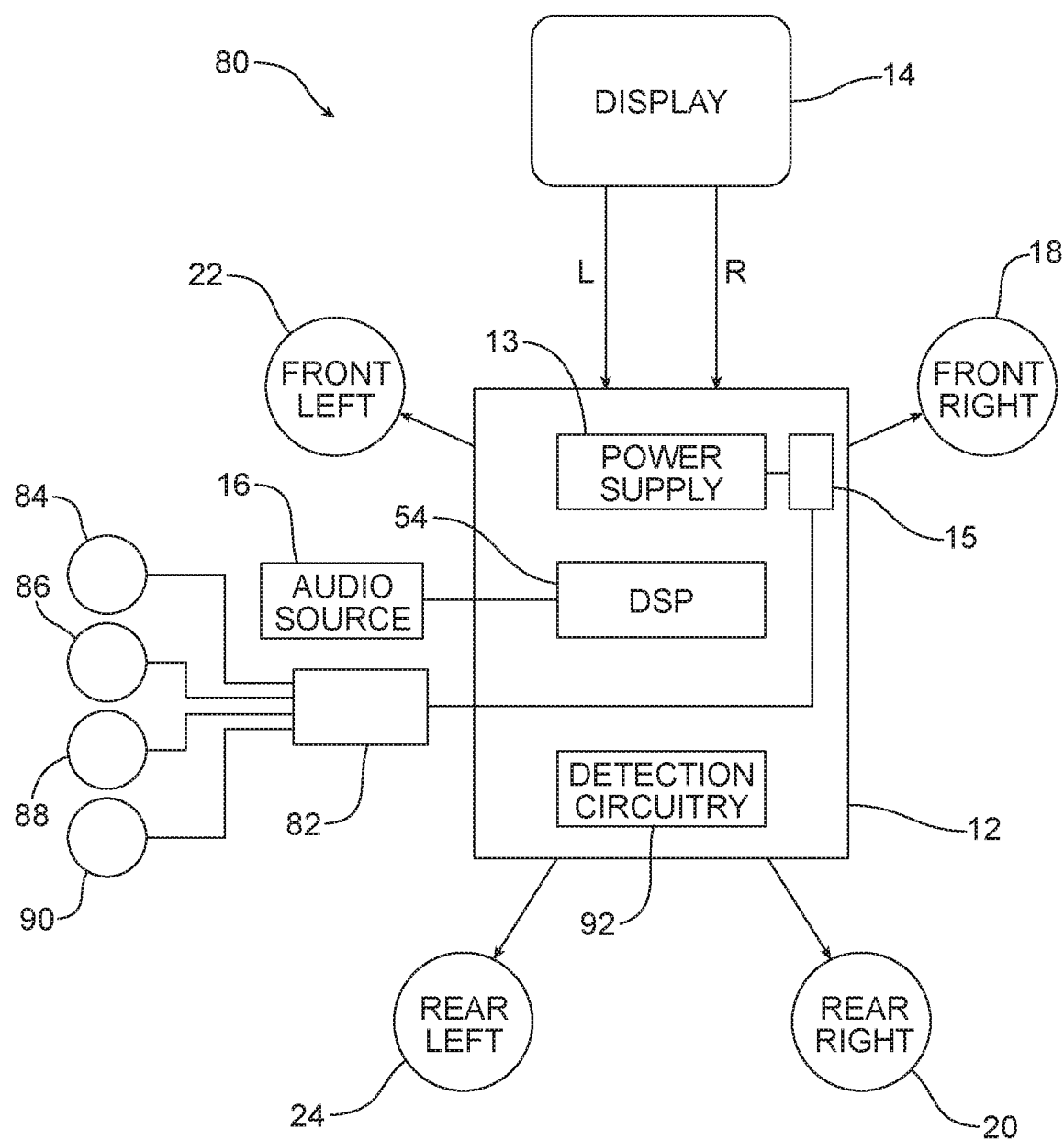
FIG. 7 is an overall schematic of an alternate embodiment of an audio system.

In addition to reconfiguration, the described embodiment also provides an expansion capability as noted above. In this instance, the power supply 13 is designed or configured to power four external speaker amplifiers 38. A controller 15 associated with the power supply 13, however, provides control for up to eight speakers in this embodiment. This enables system expansion by allowing a vehicle owner to add an additional power supply 82 (e.g., a power supply having fixed output voltages and is less expensive) or even conventionally powered speakers 84, 86, 88, and 90, if harnessed correctly. One such alternate embodiment of an audio system 80 is shown in FIG. 7 wherein common reference numbers are used for components common to both systems.

The foregoing descriptions of various embodiments are provided for purposes of illustration and are not intended to be exhaustive or limiting. Modifications or variations are also possible in light of the above teachings. For example, the power supply 13 and the digital signal processor (DSP) 54 are mounted on the same printed circuit board within power supply housing 12 in the described embodiment while other embodiments may include more than one printed circuit board and/or the power supply and digital signal processor (DSP) may be positioned in separate housings, etc. Even more, different circuits and methods may be utilized to identify or detect the type of speakers connected within the audio system. The embodiments described above were chosen to provide the best application to thereby enable one of ordinary skill in the art to utilize the disclosed inventions in various embodiments and with various modifications as are suited to the particular use contemplated. All such modifications and variations are within the scope of the invention.

What is claimed:

1. An audio system, comprising:
   an audio source producing an audio signal;
   at least one speaker assembly including a basket supporting a driver, a diaphragm, a surround, and a switching amplifier, the switching amplifier receiving a first or second output voltage and the audio signal and providing an amplified audio signal to the driver;
   a power supply providing the first or second voltage; and
   detection circuitry, including a controller configured to detect a type of the at least one speaker assembly at start up and to cause the power supply to provide the first or second voltage to the switching amplifier dependent upon the detected type of the at least one speaker;
   wherein a first portion of the detection circuitry includes the controller and first and second balanced audio drivers providing the audio signal to the switching amplifier via first and second balanced audio lines, and a second portion of the detection circuitry is supported by the basket.

2. The audio system of claim 1, wherein the driver is supported by a bracket attached to the basket, the driver is attached to the diaphragm, and a surround joins the diaphragm and the basket.

3. The audio system of claim 1, wherein the switching amplifier is supported by a housing attached to the basket.

4. The audio system of claim 3, wherein the housing includes a plurality of legs for mounting the housing to the basket.

5. The audio system of claim 1, wherein the vehicle is a motorcycle.

6. The audio system of claim 1, wherein the first portion of the detection circuitry further includes an analog to digital converter, in communication with the controller, for detecting a voltage superimposed onto the first and second balanced audio lines.

7. The audio system of claim 6, wherein the switching amplifier is supported by a housing attached to the basket.

8. The audio system of claim 6, wherein the first portion of the detection circuitry includes a first resistor, the second portion of the detection circuitry includes a second resistor, and the detected voltage is determined by a ratio of the first and second resistors.

9. The audio system of claim 8, wherein the switching amplifier is supported by a housing attached to the basket.

10. The audio system of claim 6, wherein the driver is supported by a bracket attached to the basket, the driver is attached to the diaphragm, and a surround joins the diaphragm and the basket.

11. The audio system of claim 6, wherein the housing includes a plurality of legs for mounting the housing to the basket.

12. A vehicle including the invention of claim 1, further comprising a digital signal processor configured to adjust a frequency response of the audio signal dependent upon a speed of the vehicle.

13. The audio system of claim 12, wherein the driver is supported by a bracket attached to the basket, the driver is attached to the diaphragm, and a surround joins the diaphragm and the basket.

14. The audio system of claim 12, wherein the switching amplifier is supported by a housing attached to the basket.

15. The audio system of claim 14, wherein the housing includes a plurality of legs for mounting the housing to the basket.

16. The audio system of claim 12, wherein the first portion of the detection circuitry further includes an analog to digital converter, in communication with the controller, for detecting a voltage superimposed onto the first and second balanced audio lines.

17. The audio system of claim 16, wherein the first portion of the detection circuitry includes a first resistor, the second portion of the detection circuitry includes a second resistor, and the detected voltage is determined by a ratio of the first and second resistors.

18. The audio system of claim 12, wherein the vehicle is a motorcycle.

* * * * *